(12) United States Patent
Chan et al.

(10) Patent No.: US 11,067,634 B2
(45) Date of Patent: Jul. 20, 2021

(54) METHOD AND APPARATUS FOR ESTIMATING STATE OF CHARGE OF BATTERY, AND COMPUTER READABLE STORAGE MEDIUM

(71) Applicant: THE HKUST FOK YING TUNG RESEARCH INSTITUTE, Guangdong (CN)

(72) Inventors: Ka Chung Chan, Guangdong (CN); Lung Fai Moses Ng, Guangdong (CN); Chi Li Wu, Guangdong (CN); Yu Hang Christopher Chao, Guangdong (CN)

(73) Assignee: THE HKUST FOK YING TUNG RESEARCH INSTITUTE, Guangzhou (CN)

(*) Notice: Subject to any disclaimer, the term of this patent is extended or adjusted under 35 U.S.C. 154(b) by 161 days.

(21) Appl. No.: 16/422,076

(22) Filed: May 24, 2019

(65) Prior Publication Data
US 2019/0277917 A1    Sep. 12, 2019

Related U.S. Application Data

(63) Continuation-in-part of application No. PCT/CN2017/113200, filed on Nov. 27, 2017.

(30) Foreign Application Priority Data

Sep. 14, 2017 (CN) .......................... 201710827417.9

(51) Int. Cl.
*G06F 11/30* (2006.01)
*G01R 31/367* (2019.01)
*G01R 31/3835* (2019.01)
*G01R 31/387* (2019.01)

(52) U.S. Cl.
CPC ......... *G01R 31/367* (2019.01); *G01R 31/387* (2019.01); *G01R 31/3835* (2019.01)

(58) Field of Classification Search
CPC .................................................. G01R 31/367
See application file for complete search history.

(56) References Cited

FOREIGN PATENT DOCUMENTS

CN    106405421 A  *  7/2015

* cited by examiner

*Primary Examiner* — Phuong Huynh

(57) ABSTRACT

A method for estimating a state of charge of a battery includes obtaining a discharge voltage and discharge capacity curve of a battery under a preset discharge current, in responding to an order for estimating the state of charge of the battery; matching the discharge voltage and discharge capacity curve with a plurality of standard curves in a database, thereby obtaining an optimal matching curve with respect to the discharge voltage and discharge capacity curve; and calculating the state of charge of the battery according to the optimal matching curve, under a preset discharge stage. The present method can accurately calculate the state of charge of the battery with simple calculation manners.

11 Claims, 3 Drawing Sheets obtaining a discharge voltage and discharge capacity curve of a battery under a preset discharge current, in responding to an order for estimating the state of charge of the battery — S1 matching the discharge voltage and discharge capacity curve with a plurality of standard curves in a database, thereby obtaining an optimal matching curve with respect to the discharge voltage and discharge capacity curve — S2 calculating the state of charge (SOC) of the battery according to the optimal matching curve, under a preset discharge stage — S3

METHOD AND APPARATUS FOR ESTIMATING STATE OF CHARGE OF BATTERY, AND COMPUTER READABLE STORAGE MEDIUM

CROSS-REFERENCE TO RELATED APPLICATIONS

The present application is a Continuation-in-part Application of PCT application No. PCT/CN2017/113200 filed on Nov. 27, 2017, which claims the benefit of Chinese Patent Application No. 201710827417.9 filed on Sep. 14, 2017, the contents of the above are hereby incorporated by reference.

FIELD OF THE INVENTION

The present invention relates to battery managements and, more particularly to a method for estimating a state of charge of a battery.

BACKGROUND OF THE INVENTION

Lithium-ion battery is one of the most promising technologies in the battery industry. Due to its high power density, high voltage, long cycle life, low self-discharge, no memory effect and environmental harmlessness, lithium-ion battery is now widely used in portable PC and mobile phones. The global lithium-ion battery market has been growing rapidly over the past decade. In addition, by 2020, emerging pure electric vehicle (EV) batteries will even triple the total lithium-ion battery market today. Since lithium-ion battery technology is heavily involved in people's daily lives and will play a more important role in the future, its safety issues, such as overcharge, overdischarge, voltage imbalance and thermal runaway, should attract more attention.

As one of the main parameters, the state of charge (SOC) is usually used to present the available capacity of the battery, and the estimation of SOC has become an important branch of electrochemical research. Accurate estimation of the SOC can prevent overcharging, overdischarge, and voltage imbalance to ensure that the battery is operating in the optimum area. Otherwise, these incorrect charging and discharging conditions may cause the battery to irreversibly damage. The SOC-based control strategy not only extends the cycle life of the battery, but also increases its performance to a higher level. Taking EV as an example, the fuzzy regenerative braking strategy can improve the energy-saving performance of electric vehicles based on the SOC of battery, battery temperature and other parameters.

Various research teams have proposed more and more methods to improve the accuracy of SOC estimation, including artificial neural networks, Kalman filtering and extensions thereof. However, since the charging/discharging process of the battery is quite complicated, involving the electronic and mass transport of infinitely small particles in a very compact aggregate, thus the state of charge of the battery has not been accurately measured to date.

SUMMARY OF THE INVENTION

In view of the above deficiencies, the technical problem of the present invention is to provide a method for estimating a state of charge of a battery, thereby accurately calculating the state of charge of the battery with simple calculation manners.

For solving the above technical problem, the present invention provides method for estimating a state of charge of a battery, comprising:

obtaining a discharge voltage and discharge capacity curve of a battery under a preset discharge current, in responding to an order for estimating the state of charge of the battery;

matching the discharge voltage and discharge capacity curve with a plurality of standard curves in a database, thereby obtaining an optimal matching curve with respect to the discharge voltage and discharge capacity curve; and calculating the state of charge of the battery according to the optimal matching curve, under a preset discharge stage.

As an improvement of the present invention, the standard curves are discharge voltage and discharge capacity curves that are obtained from a plurality of batteries with different using times under the discharge current; and discharge capacities of the discharge voltage and discharge capacity curves are measured by Coulometric.

As an improvement of the present invention, said matching the discharge voltage and discharge capacity curve with a plurality of standard curves in a database, thereby obtaining an optimal matching curve, comprises:

fitting the discharge voltage and discharge capacity curve according to a function model that is preset, thereby obtaining a first fitting parameter; and comparing the first fitting parameter with second fitting parameters that are obtained by fitting the standard curves according to the function model, thereby obtaining the optimal matching curve.

As an improvement of the present invention, discharge voltages of the discharge voltage and discharge capacity curve are normalized voltages ($\overline{V}$) which are calculated by following formula:

$\overline{V}$=measured value of discharge voltage/nominal voltage of battery; and discharge capacities of the discharge voltage and discharge capacity curve are normalized capacities ($\overline{Cap}$) which are calculated by following formula:

$\overline{Cap}$=measured value of discharge capacity/nominal capacity of battery.

As an improvement of the present invention, said calculating the state of charge of the battery according to the optimal matching curve, under a preset discharge stage, comprises:

obtaining a discharge stage where any one of the discharge voltages is located, according to the optimal matching curve;

if the discharge voltage is located in a middle discharge stage or a posterior discharge stage, obtaining a first discharge capacity relevant to the discharge voltage, and obtaining a second discharge capacity relevant to a minimum available voltage that is preset; and obtaining the state of charge of the battery under the discharge voltage, according to the first discharge capacity and the second discharge capacity.

As an improvement of the present invention, the first discharge capacity relevant to any discharge voltage is obtained by following formula:

$$\overline{V}=a\exp[b(\overline{Cap}-0.7)]+c\times\overline{Cap}+d;$$

the second discharge capacity relevant to the minimum available voltage is obtained by following formula:

$$\overline{V}_{end}=a\exp[b(\overline{Cap}_{end}-0.7)]+c\times\overline{Cap}_{end}+d;$$

the state of charge of the battery under the discharge voltage is obtained by following formula:

$$SOC = 1 - \frac{\overline{Cap}}{\overline{Cap}_{end}};$$

wherein, a is a proportion of an exponential function to the function model; b is a change rate of posterior voltage drop of the function model; c is a slope of a straight line in the function model; d is a ordinate of an intersection between an extension line of the straight line and a y-axis; $\overline{V}$ is a normalized voltage which is a quotient of the measured value of discharge voltage and the nominal voltage of battery; $\overline{Cap}$ is a normalized discharge capacity which is a quotient of the measured value of discharge capacity and the nominal capacity of battery; $\overline{V}_{end}$ is the minimum available voltage that is preset, and $\overline{Cap}_{end}$ is a normalized discharge voltage relevant to the minimum available voltage.

As an improvement of the present invention, the method further includes:

if the discharge voltage is located in a middle discharge stage or a posterior discharge stage, calculating the state of charge of the battery under the discharge voltage, according to the discharge capacity and the nominal capacity of the battery; and the discharge capacity is measured by Coulometric.

Accordingly, the present invention further provides an apparatus for estimating state of charge for a battery, which includes a processor, a memory, and computer programs stored in the memory and configured to be executed by the processor, wherein the method for estimating a state of charge for a battery is achieved when the processor executes the computer programs.

Accordingly, the present invention further provides a computer readable storage medium, comprising computer programs stored therein, wherein the method for estimating state of charge for a battery is performed by an apparatus to which the computer readable storage medium pertains when the computer programs are run.

DETAILED DESCRIPTION OF ILLUSTRATED EMBODIMENTS

A distinct and full description of the technical solution of the present invention will follow by combining with the accompanying drawings. By all appearances, the embodiments to be described just are a part of embodiments of the present invention, not the all. Based on the embodiment of the present invention, all other embodiments obtained by the person ordinarily skilled in the art without any creative work pertain to the protection scope of the present invention.

Figure 1:
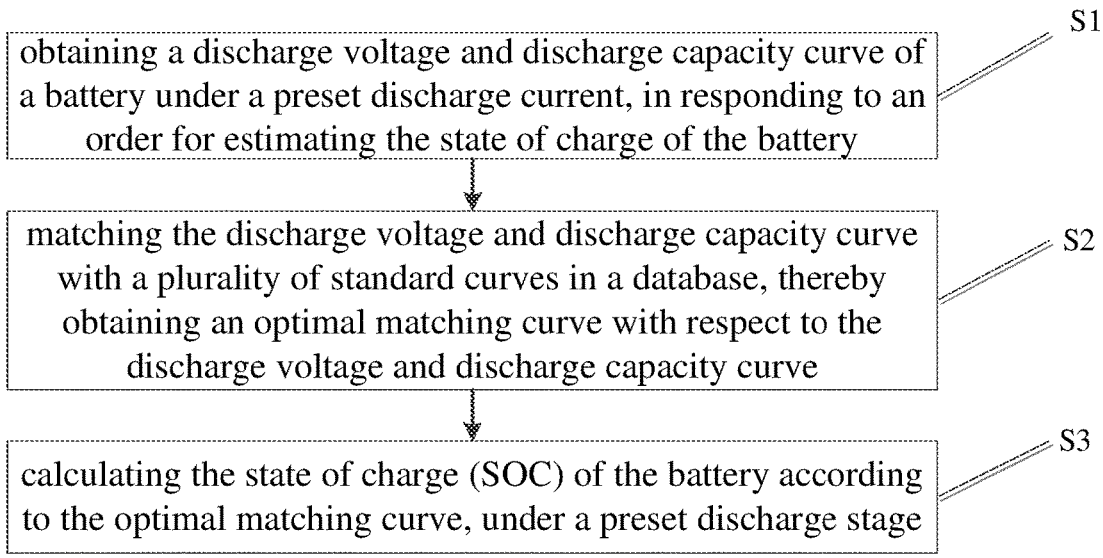
FIG. 1 is a flowchart of a method for estimating a state of charge of a battery according to a first embodiment of the present invention.

Referring to FIG. 1, a method for estimating a state of charge (SOC) of a battery includes the following steps:

S1, obtaining a discharge voltage and discharge capacity curve of a battery under a preset discharge current, in responding to an order for estimating the state of charge of the battery.

In this step S1, the discharge capacity of the discharge voltage and discharge capacity curve is measured by Coulometric.

S2, matching the discharge voltage and discharge capacity curve with a plurality of standard curves in a database, thereby obtaining an optimal matching curve with respect to the discharge voltage and discharge capacity curve.

Figure 2:
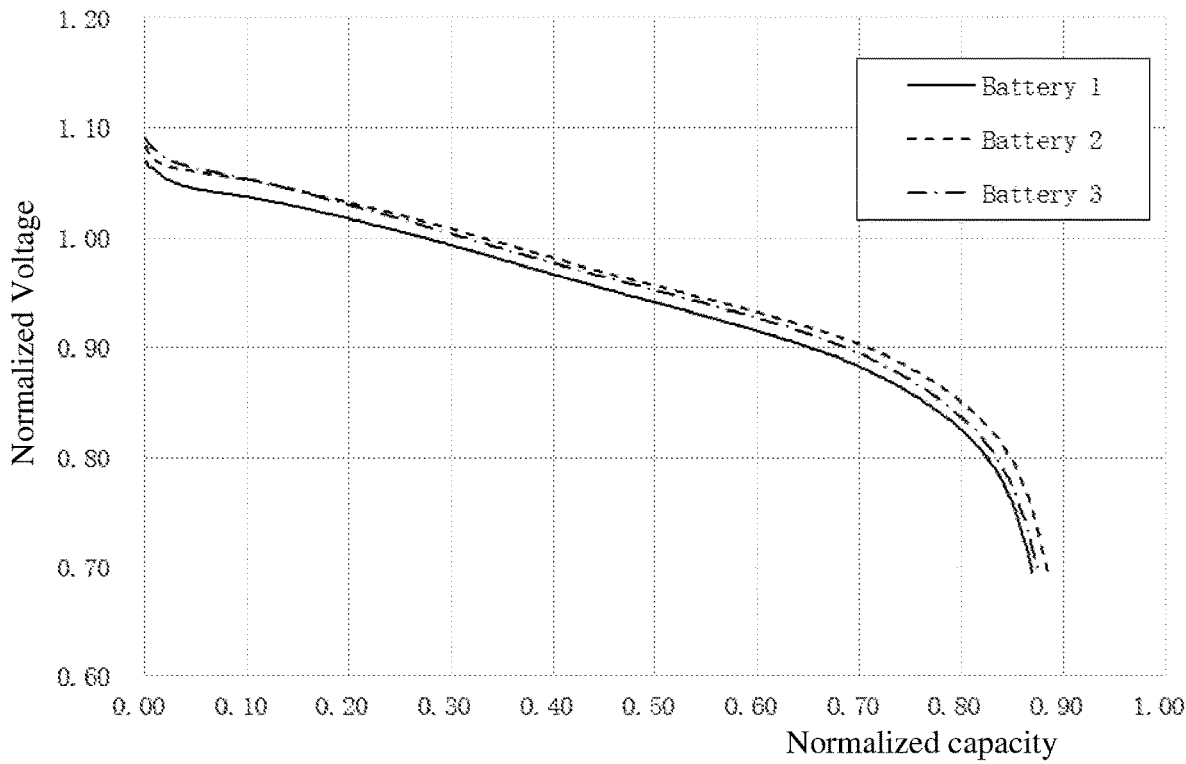
FIG. 2 is a chart showing discharge curves of batteries with different discharge times.

Specifically, the standard curves are discharge voltage and discharge capacity curves that are obtained from a plurality of batteries with different using times under the discharge current. As illustrated in FIG. 2 which is a chart showing discharge voltage and discharge capacity curves of batteries with different using times, each discharge curve includes three sections indicating three stages. Specifically, a first section defines an initial discharge stage indicating a voltage initial drop due to the polarization, a second section defines a middle discharge stage indicating a voltage linear drop along with the discharge process, and a third section defines a posterior discharge stage indicating a voltage rapid drop due to the diffusion barrier.

In the discharge voltage and discharge capacity curves of FIG. 2, the discharge voltages are normalized voltages which are calculated by the following formula:

$\overline{V}$=measured value of discharge voltage/nominal voltage of battery; and $\overline{V}$ is the normalized voltage.

The discharge capacities of the discharge voltage and discharge capacity curves are normalized capacities which are calculated by following formula:

$\overline{Cap}$=measured value of discharge capacity/nominal capacity of battery; and $\overline{Cap}$ is the normal discharge capacity.

Preferably, the optimal matching curve is obtained by the following manners:

fitting the discharge voltage and discharge capacity curve according to a function model that is preset, thereby obtaining a first fitting parameter; and comparing the first fitting parameter with second fitting parameters that are obtained by fitting the standard curves according to the function model, thereby obtaining the optimal matching curve.

Figure 3:
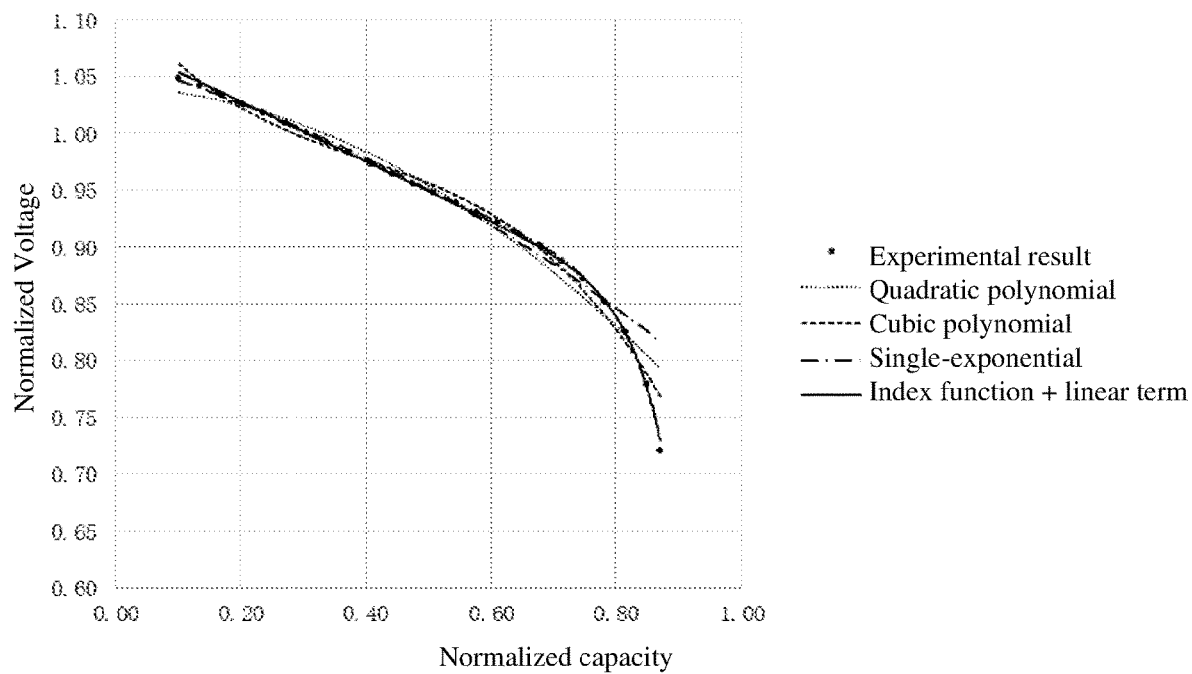
FIG. 3 is a chart showing error comparison of experimental result for different mathematical models.

Polynomials are often used as a simple function model, and polynomial fitting process is simple and flexible for simple data. But for high-order polynomial fitting becomes unstable, and the fitting results will not be representative. In addition, any order of polynomials can provide good fitting within the data range, but will deviate significantly from this range. Table 1 shows the errors of different models obtained by comparison experiments. In Table 1, the combination of exponential and linear models can greatly reduce the measurement error and improve the accuracy of SOC estimation. The fitting curve of each model can be seen as shown in FIG. 3.

TABLE 1

Errors under different models

| Mathematic relation | Formula | Error at the 100$^{th}$ 0.5 C discharge cycle |
|---|---|---|
| Quadratic polynomial | $V = a \cdot Ah^2 + b \cdot Ah + c$ | 10.0% |
| Cubic polynomial | $V = a \cdot Ah^3 + b \cdot Ah^2 + c \cdot Ah + d$ | 6.7% |
| Single-exponential | $V = a \cdot \exp\{b \cdot (Ah - 0.7)/_f + c$ | 13.3% |
| Double-exponential | $V = a \cdot \exp(b \cdot Ah) + c \cdot \exp(d \cdot Ah)$ | 1.9% |
| Index + linear | $V = a \cdot \exp\{b \cdot (Ah - 0.7)/_f + c \cdot Ah + d$ | 1.2% |

Therefore, the present invention uses a model combining with the index and the linear. The linear term within the mathematical model of the present invention is only used to fit the performance of the battery when the performance curve is straight; the exponential function is used to fit the performance of the battery in the final diffusion barrier stage, and the battery performance curve changes drastically in this stage. Using this model not only simplifies the fitting process, but also reduces the calculation error and improves the accuracy of the SOC estimation.

The mathematical model further correlates the SOC data with the SOC of the battery, whereby the user can determine the SOC of a particular battery that has experienced a known number of cycles.

S3, calculating the state of charge (SOC) of the battery according to the optimal matching curve, under a preset discharge stage.

Generally, errors at the middle discharge stage and the posterior discharge stage are more significant, thus the present method is mainly applied to SOC estimations at the middle discharge stage and the posterior discharge stage.

Specifically, in the step S3, the detailed process includes:

obtaining a discharge stage where any one of the discharge voltages is located, according to the optimal matching curve;

if the discharge voltage is located in the middle discharge stage or the posterior discharge stage, obtaining a first discharge capacity relevant to the discharge voltage, and obtaining a second discharge capacity relevant to a minimum available voltage that is preset; and obtaining the SOC of the battery under the discharge voltage, according to the first discharge capacity and the second discharge capacity.

Different discharge voltages are relevant to different discharge times, thus different SOCs under different discharge times can be obtained by the above process.

Furthermore, the first discharge capacity relevant to any discharge voltage is obtained by following formula:

$$\overline{V} = a \exp[b(\overline{Cap} - 0.7)] + c \times \overline{Cap} + d;$$

the second discharge capacity relevant to the minimum available voltage is obtained by following formula:

$$\overline{V}_{end} = a \exp[b(\overline{Cap}_{end} - 0.7)] + c \times \overline{Cap}_{end} + d;$$

and the SOC of the battery under the discharge voltage is obtained by following formula:

$$SOC = 1 - \frac{\overline{Cap}}{\overline{Cap}_{end}};$$

wherein, a is a proportion of an exponential function to the function model; b is a change rate of posterior voltage drop of the function model; c is a slope of a straight line in the function model; d is a ordinate of an intersection between an extension line of the straight line and a y-axis; $\overline{V}$ is a normalized voltage which is a quotient of the measured value of discharge voltage and the nominal voltage of battery; $\overline{Cap}$ is a normalized discharge capacity which is a quotient of the measured value of discharge capacity and the nominal capacity of battery; $\overline{V}_{end}$ is the minimum available voltage that is preset, and $\overline{Cap}_{end}$ is a normalized discharge voltage relevant to the minimum available voltage.

At the initial discharge stage, the SOC estimated by the nominal capacity of battery will not has significant error, thus if the discharge voltage is located in the middle discharge stage or the posterior discharge stage, calculating the SOC of the battery under the discharge voltage, according to the discharge capacity and the nominal capacity of the battery; and the discharge capacity is measured by Coulometric. Specifically, SOC=-discharge capacity/nominal capacity of the battery.

Figure 4:
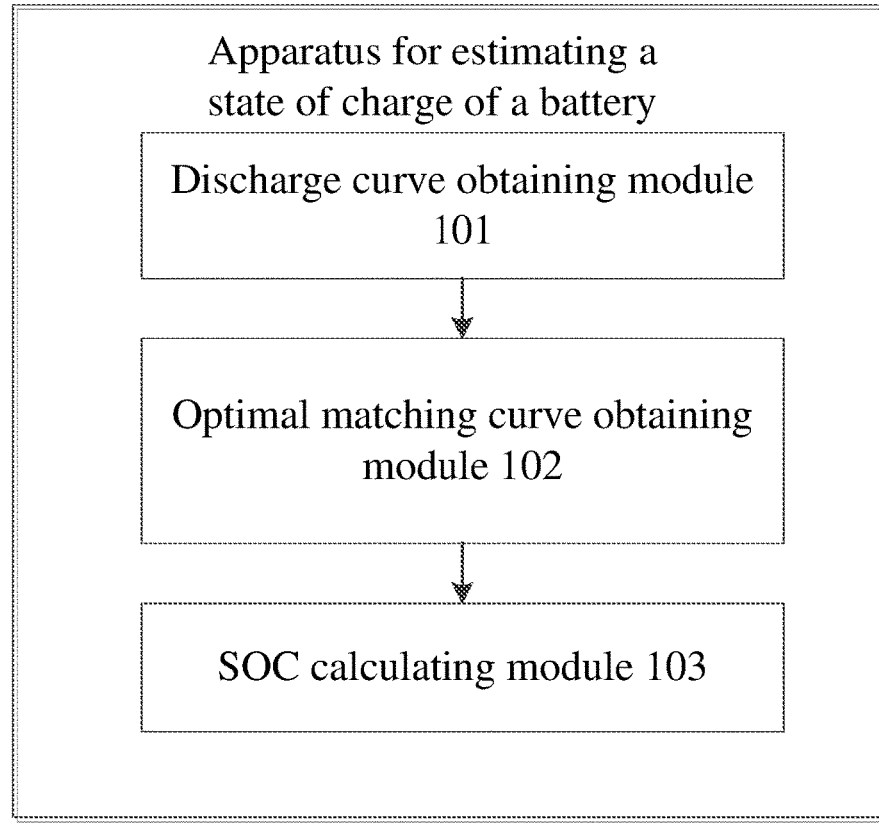
FIG. 4 is a schematic view of an apparatus for estimating a state of charge of a battery according to a second embodiment of the present invention.

Referring to FIG. 4 showing a schematic view of an apparatus for estimating a state of charge of a battery according to a second embodiment of the present invention, the apparatus includes:

a discharge curve obtaining module 101, adapted for obtaining a discharge voltage and discharge capacity curve of a battery under a preset discharge current, in responding to an order for estimating the state of charge of the battery;

an optimal matching curve obtaining module 102, adapted for matching the discharge voltage and discharge capacity curve with a plurality of standard curves in a database, thereby obtaining an optimal matching curve with respect to the discharge voltage and discharge capacity curve; and a SOC calculating module 103, adapted for calculating the SOC of the battery according to the optimal matching curve, under a preset discharge stage.

Figure 5:
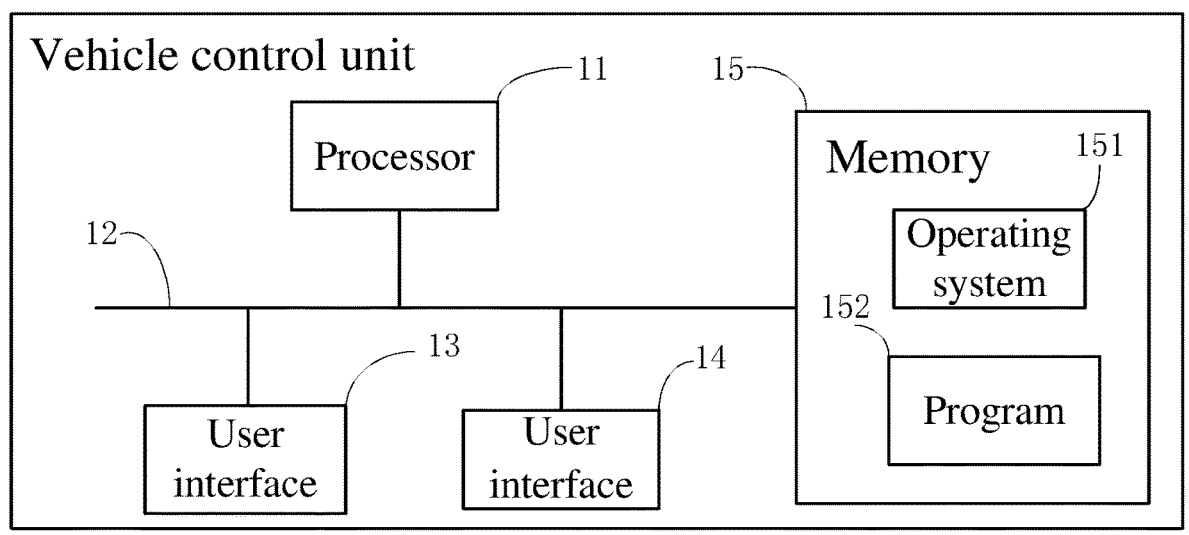
FIG. 5 is a schematic view of an apparatus for estimating a state of charge of a battery according to a third embodiment of the present invention.

Referring to FIG. 5, an apparatus for estimating SOC of a battery according to a third embodiment of the present invention includes a processor 11, such as a CPU, at least one network interface 14 or other user interfaces 13, a memory 15, and at least one communication bus 12 for communicating above assemblies one another. Specifically, the user interfaces 13 can include USB interfaces, or other standard interfaces, wired interfaces; the network interfaces 14 can be Wi-Fi interfaces or other wireless interfaces. The memory 15 may include high speed RAM memory, or non-volatile memory, such as at least one disk memory. Optionally, the memory 15 can include a storage device located far away from the processor 11.

In some embodiments, the memory 15 stores the following elements, executable modules or data structures, or subsets thereof, or extension sets thereof:

operating system 151, including various system programs, such as a battery management system and the like, for implementing various basic services and processing hardware-based tasks; and programs 152.

Specifically, the processor 11 is used for calling programs 152 stored in the memory 15, and implementing the method for estimating a state of charge for a battery, such as the step S11 shown in FIG. 1. Or, the processor 11 executes the computer programs for achieving functions of modules/units in the apparatus mentioned above, such as SOC calculating modules.

Illustratively, the computer programs can be partitioned into one or more modules/units that are stored in the memory and executed by the processor to perform the present invention. The one or more modules/units may be a series of computer program instruction segments capable of performing a particular function, the instruction segments being used to describe the executions of the computer programs in the device for estimating a state of charge for a battery.

The apparatus for estimating the state of charge of the battery may include, but is not limited to, the processor 11 and the memory 15. It will be understood by those skilled in the art that the schematic diagram is merely an example of a device for estimating the state of the battery state, and does not constitute a limitation on the device for estimating the state of charge of the battery, and may include more or less components, or a combination of some of the components, or different components, such as the apparatus for the state of charge of the battery may also include input and output devices, network access devices, buses, and the like.

The said processor 11 can be central processing unit (CPU), or other general purpose processors, digital signal processor (DSP), application specific integrated circuit (ASIC), field-programmable gate array (FPGA), or other programmable logic devices, discrete gates or transistor logic devices, discrete hardware components, etc. The general purpose processor may be a microprocessor or other conventional processors, and the processor 11 is the control center of the device for estimating the state of charge of the battery, adapted for connecting each part of the apparatus for estimating the state of charge of the battery by using various interfaces and lines.

The memory 15 can be used to store the computer programs and/or modules, the processor 11 implementing the programs by running or executing the computer programs and/or modules stored in the memory, and recalling data stored in the memory, thereby achieving the various functions of the apparatus for estimating the state of charge of the battery. The memory 15 may mainly include a storage program area and a storage data area, wherein the storage program area may store an operating system, at least one application (such as a sound playing function, an image playing function, etc.), and the like. The storage data area can store the data created based on the use of the phone (such as audio data, phone book, etc.). In addition, the memory 15 may include a high-speed random access memory, and may also include a non-volatile memory such as a hard disk, a memory, a plug-in hard disk, a smart memory card (SMC), and a secure digital (SD), a flash card, at least one disk storage device, a flash device, or other volatile solid state storage devices.

Specifically, the modules/units integrated in the apparatus for estimating the state of charge of the battery can be stored in a computer readable storage medium if implemented in the form of a software functional unit and sold or used as a standalone product. Based on such understanding, all or part of the processes in the foregoing embodiments of the present invention may also be completed by computer programs. The computer programs may be stored in a computer readable storage medium. The steps of the various method embodiments described above may be implemented when the programs are executed by the processor. The computer programs comprise computer program codes, which may be in the form of source codes, object codes, executable files or some intermediate forms. The computer readable medium may include any entity or device capable of carrying the computer program codes, a recording medium, a USB flash drive, a removable hard disk, a magnetic disk, an optical disk, a computer memory, a read-only memory (ROM), a random access memory (RAM), electrical carrier signals, telecommunications signals, and software distribution media. It should be noted that the content contained in the computer readable medium may be appropriately increased or decreased according to the requirements of legislation and patent practice in a jurisdiction, for example, in some jurisdictions, computer readable media does not include electrical carrier signals and telecommunication signals according to legislation and patent practice.

While the invention has been described in connection with what are presently considered to be the most practical and preferable embodiments, it is to be understood that the invention is not to be limited to the disclosed embodiments, but on the contrary, is intended to cover various modifications and equivalent arrangements included within the spirit and scope of the invention.

What is claimed is:

1. A method for estimating a state of charge of a battery, comprising:

obtaining a discharge voltage and discharge capacity curve of a battery under a preset discharge current, in responding to an order for estimating the state of charge of the battery;

matching the discharge voltage and discharge capacity curve with a plurality of standard curves in a database, thereby obtaining an optimal matching curve with respect to the discharge voltage and discharge capacity curve; and calculating the state of charge of the battery according to the optimal matching curve, under a preset discharge stage;

wherein said matching the discharge voltage and discharge capacity curve with a plurality of standard curves in a database, thereby obtaining an optimal matching curve, comprises:

fitting the discharge voltage and discharge capacity curve according to a function model that is preset, thereby obtaining a first fitting parameter; and comparing the first fitting parameter with second fitting parameters that are obtained by fitting the standard curves according to the function model, thereby obtaining the optimal matching curve;

wherein discharge voltages of the discharge voltage and discharge capacity curve are normalized voltages ($\overline{V}$) which are calculated by following formula:

$\overline{V}$=measured value of discharge voltage/nominal voltage of battery; and discharge capacities of the discharge voltage and discharge capacity curve are normalized capacities ($\overline{Cap}$) which are calculated by following formula:

$\overline{Cap}$=measured value of discharge capacity/nominal capacity of battery;

wherein the function model is:

$$\overline{V}=a\ \exp\ [b(\overline{Cap}-0.7)]+c\times\overline{Cap}+d;$$

wherein, a, b, c and d are fitting parameters of the function model, $\overline{V}$ is the normalized voltage, and $\overline{Cap}$ is the normal discharge capacity.

2. The method for estimating a state of charge of a battery according to claim 1, wherein the standard curves are discharge voltage and discharge capacity curves that are obtained from a plurality of batteries with different using times under the discharge current; and discharge capacities of the discharge voltage and discharge capacity curves are measured by Coulometric.

3. The method for estimating a state of charge of a battery according to claim 1, wherein said calculating the state of charge of the battery according to the optimal matching curve, under a preset discharge stage, comprises:
  obtaining a discharge stage where any one of the discharge voltages is located, according to the optimal matching curve;
  if the discharge voltage is located in a middle discharge stage or a posterior discharge stage, obtaining a first discharge capacity relevant to the discharge voltage, and obtaining a second discharge capacity relevant to a minimum available voltage that is preset; and
  obtaining the state of charge of the battery under the discharge voltage, according to the first discharge capacity and the second discharge capacity.

4. The method for estimating a state of charge of a battery according to claim 3, wherein the first discharge capacity relevant to any discharge voltage is obtained by following formula:

$$\overline{V} = a\ \exp\ [b(\overline{Cap} - 0.7)] + c \times \overline{Cap} + d;$$

the second discharge capacity relevant to the minimum available voltage is obtained by following formula:

$$\overline{V}_{end} = a\ \exp\ [b(\overline{Cap}_{end} - 0.7)] + c \times \overline{Cap}_{end} + d;$$

the state of charge of the battery under the discharge voltage is obtained by following formula:

$$SOC = 1 - \frac{\overline{Cap}}{\overline{Cap}_{end}};$$

wherein, a is a proportion of an exponential function to the function model; b is a change rate of posterior voltage drop of the function model; c is a slope of a straight line in the function model; d is a ordinate of an intersection between an extension line of the straight line and a y-axis; $\overline{V}$ is a normalized voltage which is a quotient of the measured value of discharge voltage and the nominal voltage of battery; $\overline{Cap}$ is a normalized discharge capacity which is a quotient of the measured value of discharge capacity and the nominal capacity of battery; $\overline{V}_{end}$ is the minimum available voltage that is preset, and $\overline{Cap}_{end}$ is a normalized discharge voltage relevant to the minimum available voltage.

5. The method for estimating a state of charge of a battery according to claim 3, further comprising:
  if the discharge voltage is located in a middle discharge stage or a posterior discharge stage, calculating the state of charge of the battery under the discharge voltage, according to the discharge capacity and the nominal capacity of the battery; and the discharge capacity is measured by Coulometric.

6. An apparatus for estimating state of charge for a battery, comprising a processor, a memory, and computer programs stored in the memory and configured to be executed by the processor, wherein the method for estimating a state of charge for a battery according to claim 1 is achieved when the processor executes the computer programs.

7. The apparatus for estimating state of charge for a battery according to claim 6, wherein said calculating the state of charge of the battery according to the optimal matching curve, under a preset discharge stage, comprises:
  obtaining a discharge stage where any one of the discharge voltages is located, according to the optimal matching curve;
  if the discharge voltage is located in a middle discharge stage or a posterior discharge stage, obtaining a first discharge capacity relevant to the discharge voltage, and obtaining a second discharge capacity relevant to a minimum available voltage that is preset; and
  obtaining the state of charge of the battery under the discharge voltage, according to the first discharge capacity and the second discharge capacity.

8. The apparatus for estimating state of charge for a battery according to claim 6, wherein the first discharge capacity relevant to any discharge voltage is obtained by following formula:

$$\overline{V} = a\ \exp\ [b(\overline{Cap} - 0.7)] + c \times \overline{Cap} + d;$$

the second discharge capacity relevant to the minimum available voltage is obtained by following formula:

$$\overline{V}_{end} = a\ \exp\ [b(\overline{Cap}_{end} - 0.7)] + c \times \overline{Cap}_{end} + d;$$

the state of charge of the battery under the discharge voltage is obtained by following formula:

$$SOC = 1 - \frac{\overline{Cap}}{\overline{Cap}_{end}};$$

wherein, a is a proportion of an exponential function to the function model; b is a change rate of posterior voltage drop of the function model; c is a slope of a straight line in the function model; d is a ordinate of an intersection between an extension line of the straight line and a y-axis; $\overline{V}$ is a normalized voltage which is a quotient of the measured value of discharge voltage and the nominal voltage of battery; $\overline{Cap}$ is a normalized discharge capacity which is a quotient of the measured value of discharge capacity and the nominal capacity of battery; $\overline{V}_{end}$ is the minimum available voltage that is preset, and $\overline{Cap}_{end}$ is a normalized discharge voltage relevant to the minimum available voltage.

9. A computer readable storage medium, comprising computer programs stored therein, wherein the method for estimating state of charge for a battery according to claim 1 is performed by an apparatus to which the computer readable storage medium pertains when the computer programs are run.

10. The computer readable storage medium according to claim 9, wherein said calculating the state of charge of the battery according to the optimal matching curve, under a preset discharge stage, comprises:
  obtaining a discharge stage where any one of the discharge voltages is located, according to the optimal matching curve;
  if the discharge voltage is located in a middle discharge stage or a posterior discharge stage, obtaining a first discharge capacity relevant to the discharge voltage, and obtaining a second discharge capacity relevant to a minimum available voltage that is preset; and
  obtaining the state of charge of the battery under the discharge voltage, according to the first discharge capacity and the second discharge capacity.

11. The computer readable storage medium according to claim 9, wherein the first discharge capacity relevant to any discharge voltage is obtained by following formula:

$$\overline{V} = a\ \exp\ [b(\overline{Cap} - 0.7)] + c \times \overline{Cap} + d;$$

the second discharge capacity relevant to the minimum available voltage is obtained by following formula:

$$\overline{V}_{end} = a\ \exp\ [b(\overline{Cap}_{end} - 0.7)] + c \times \overline{Cap}_{end} + d;$$

the state of charge of the battery under the discharge voltage is obtained by following formula:

$$SOC = 1 - \frac{\overline{Cap}}{\overline{Cap}_{end}};$$

wherein, a is a proportion of an exponential function to the function model; b is a change rate of posterior voltage drop of the function model; c is a slope of a straight line in the function model; d is a ordinate of an intersection between an extension line of the straight line and a y-axis; $\overline{V}$ is a normalized voltage which is a quotient of the measured value of discharge voltage and the nominal voltage of battery; $\overline{Cap}$ is a normalized discharge capacity which is a quotient of the measured value of discharge capacity and the nominal capacity of battery; $\overline{V}_{end}$ is the minimum available voltage that is preset, and $\overline{Cap}_{end}$ is a normalized discharge voltage relevant to the minimum available voltage.

* * * * *